United States Patent [19]

Brennan

[11] Patent Number: 5,245,568
[45] Date of Patent: Sep. 14, 1993

[54] FERROELECTRIC SPACE CHARGE CAPACITOR MEMORY SYSTEM

[75] Inventor: Ciaran J. Brennan, Bedford, Mass.

[73] Assignee: Charles Stark Draper Laboratory, Inc., Cambridge, Mass.

[21] Appl. No.: 792,888

[22] Filed: Nov. 15, 1991

Related U.S. Application Data

[63] Continuation-in-part of Ser. No. 630,027, Dec. 19, 1990, Pat. No. 5,151,877, and a continuation-in-part of Ser. No. 630,038, Dec. 19, 1990, Pat. No. 5,140,548.

[51] Int. Cl.$^5$ ............................................. G11C 11/22
[52] U.S. Cl. ............................ 365/145; 365/189.01
[58] Field of Search ................... 365/145, 189.01, 149

[56] References Cited

U.S. PATENT DOCUMENTS

5,140,548 8/1992 Brennan .................. 365/189.01
5,151,877 9/1992 Brennan .................. 365/189.01

*Primary Examiner*—Eugene R. LaRoche
*Assistant Examiner*—Tan Nguyen
*Attorney, Agent, or Firm*—Iandiorio & Dingman

[57] ABSTRACT

A ferroelectric space charge capacitor memory system includes a ferroelectric space charge capacitor memory cell having two ferroelectric space charge capacitor memory devices; a write circuit for applying coercive write voltage to each of the memory devices to establish internal polarization fields and space charge regions of opposite polarity in each device, respectively; a bias voltage circuit for applying to each of the devices a bias voltage less than the coercive voltage at a rate slower than the rate of space charge formation to define a capacitive level representative of one of the polarization states; a read signal circuit for introducing to each of the devices a read signal at a rate faster than the rate of space charge formation, which together with the bias voltage is less than the coercive voltage; and a detector responsive to the read signal for indicating the difference in charge transferred by each memory device representing the logical state of the memory cell.

10 Claims, 6 Drawing Sheets

FERROELECTRIC SPACE CHARGE CAPACITOR MEMORY SYSTEM

RELATED CASES

This application is a continuation-in-part of U.S. Ser. No. 07/630,027, filed Dec. 19, 1990, now U.S. Pat. No. 5,151,877, entitled "Ferroelectric Space Charge Capacitor Memory System", by Ciaran J. Brennan; and U.S. Ser. No. 07/630,038, now U.S. Pat. No. 5,140,548 filed Dec. 19, 1990, entitled "Ferroelectric Space Charge Capacitor Memory", by Ciaran J. Brennan.

FIELD OF INVENTION

This invention relates to an improved ferroelectric space charge capacitor memory system, and more particularly to such an improved system which uses individual ferroelectric space charge capacitor memory devices in pairs to form differential ferroelectric space charge capacitor cells.

BACKGROUND OF INVENTION

A recent improvement in ferroelectric capacitor memory devices uses manipulation of the dielectric properties as opposed to the polarization to effect the memory function. Those devices, explained more fully in a copending U.S. patent application, "Ferroelectric Space Charge Capacitor Memory", Ciaran J. Brennan, filed on even date herewith and incorporated herein by reference, manipulates the space charge to store and non-destructively read out the stored data. The ferroelectric space charge memory devices are typically fabricated using thin film monolithic integrated circuit technology. Such devices are subject to uneven film thicknesses and other manufacturing variations. This can result in a lack of uniformity in the capacitive values or other dielectric properties over the area of the chip. Thus when a plurality of such devices are to be written to and read from as a group, some of them may never reach or always exceed uniform levels representing the logical states of stored data: a memory device may always read a "1" or "0" regardless of the value actually written into it.

Further, even if the group or assembly of ferroelectric space charge capacitor memory devices is actually operating within the proper range, the change or drift with time and/or temperature may well shift one or more such devices into an operation region where they are no longer responding accurately.

SUMMARY OF INVENTION

It is therefore an object of this invention to provide an improved ferroelectric space charge capacitor memory system which is reliable independent of fabrication and ambient conditions.

It is a further object of this invention to provide such an improved ferroelectric space charge capacitor memory system which uses a pair of ferroelectric space charge capacitor devices in a differential memory cell.

It is a further object of this invention to provide such an improved ferroelectric space charge capacitor memory system which is insensitive to time, temperature or radiation.

The invention results from the realization that a more effective ferroelectric space charge capacitor memory system can be achieved by combining the ferroelectric space charge capacitor devices in pairs to form differential cells in which variations in the properties of the paired capacitor memory devices are offset.

This invention features a ferroelectric space charge capacitor memory system including a ferroelectric space charge capacitor memory cell having two ferroelectric space charge capacitor memory devices. There are means for applying a coercive write voltage to each of the memory devices to establish internal polarization fields and space charge regions of opposite polarities in each device. There are also means for applying to each of the devices a bias voltage less than the coercive voltage at a rate slower than the rate of space charge formation to define a capacitive level representative of one of the polarization states. There are means for introducing to each of the devices a read signal at a rate faster than the rate of space charge formation which together with the bias voltage is less than the coercive voltage, and means responsive to the read signal for indicating the difference in charge transferred by each memory device representing the logical state of the memory cell.

In a preferred embodiment, the system further includes means for selectively connecting either the coercive write voltage to the memory cell or the charge transferred to the means for indicating. The means for applying a bias voltage and the means for introducing a read signal may be connected in parallel with the memory devices in the cell. The means for applying a bias voltage and the means for introducing a read signal may be connected continuously to the memory device in the cell.

The invention also includes a ferroelectric space charge capacitor memory system in which the ferroelectric space charge capacitor memory device has a pair of spaced first and second electrodes and a ferroelectric dielectric disposed between those electrodes. There are means for applying coercive voltage to the dielectric to write the dielectric into one of two polarization states and to establish in each polarization state proximate the interface between the dielectric and electrode a space charge region having a charge opposite to that applied to the electride with a neutral region between the space charge regions. The relative size of the neutral and space charge regions define the capacitance of the dielectric. The neutral region has an internal polarization field opposite to that represented by the space charge regions. There are means for applying to the dielectric a bias voltage less than the coercive voltage at a rate slower than the rate of space charge formation to define the capacitance level representative of one of the polarization states. There are also means for introducing to the dielectric a read signal at a rate faster than the rate of space charge formation which together with teh bias voltage is less than the coercive voltage. Means responsive to the introduction of the read signal to the dielectric determines the capacitance level representative of one of the polarization states. The means for determining the capacitance may include means for detecting the displacement current transferred through the dielectric in response to the read signal. The two polarization states may include a first state in which the positive pole of the dielectric is proximate the first electrode and a negative pole is proximate the second electrode, and a second state in which the negative pole of the dielectric is proximate the first electrode and the positive pole is proximate the second electrode. The bias voltage may establish an electric field that increases the internal electric field and the size of the space charge region with a concomitant decrease in capacitance when it is additive with the internal polarization field, and decreases the internal electric field and the size of the space charge region with a concomitant decrease in capacitance when it is subtractive with the internal polarization field. The read signal may momentarily induce through the dielectric a displacement current which is proportional to the capacitance representative of the polarization state of the dielectric. The electrodes may be metal, in which case the space charge regions are in the dielectric, or the electrodes may be semiconductors, in which case the space charge regions are at least partially in the electrodes.

DISCLOSURE OF PREFERRED EMBODIMENT

Other objects, features and advantages will occur to those skilled in the art from the following description of a preferred embodiment and the accompanying drawings, in which.

Figure 1:
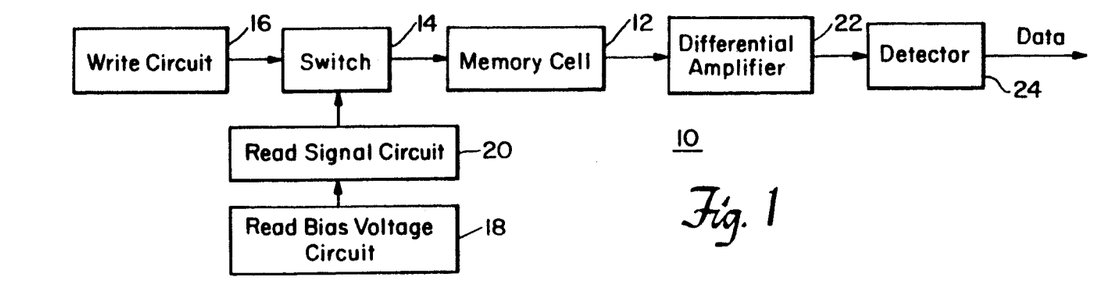
FIG. 1 is a schematic block diagram of a ferroelectric space charge capacitor memory system according to this invention.

There is shown in FIG. 1 a ferroelectric space charge capacitor memory system 10 according to this invention. Memory cell 12 is selectively supplied through switch 14 with either the coercive write voltage from write circuit 16 or the read bias voltage and the read signal from read bias voltage circuit 18 and read signal circuit 20. Switch 14 can be used to select either a positive or a negative coercive voltage for application to memory cell 12, depending upon whether a 0 or a 1 is to be written into the memory cell. Upon the application of the read bias voltage and the read signal to memory cell 12, differential amplifier 22 determines which of the memory devices in memory cell 12 is conducting more heavily. The indication of this at the output of differential amplifier 22 is sensed by detector 24, which represents the stored quantity as either a one or a zero.

Figure 2:
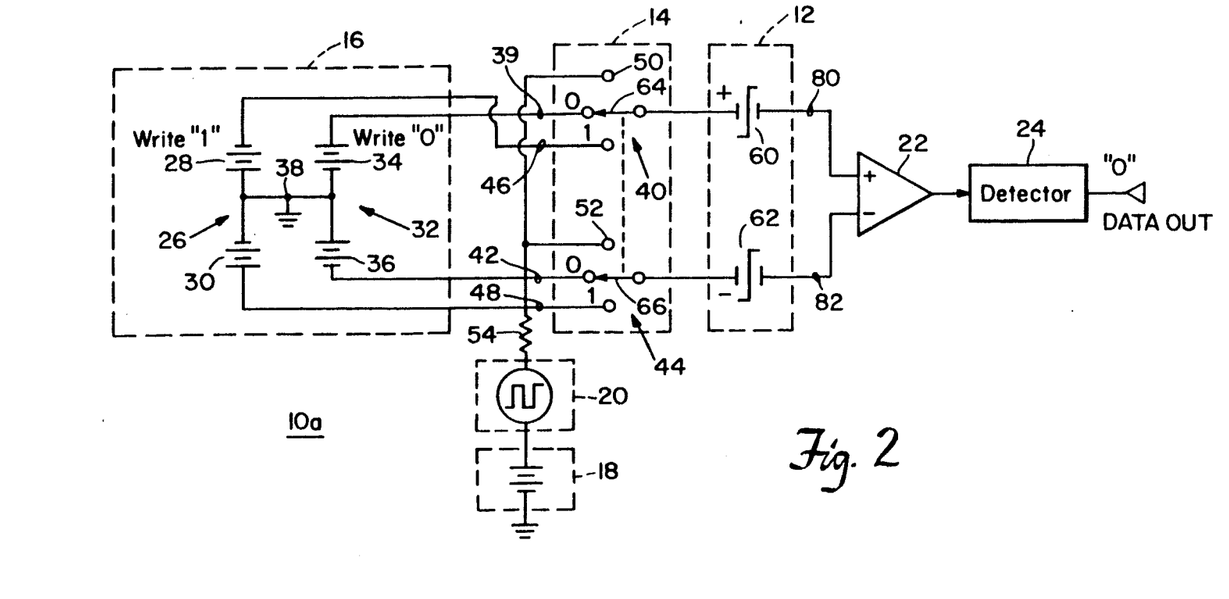
FIG. 2 is a more detailed schematic diagram of the system of FIG. 1.

A more detailed illustration of an embodiment of system 10a is shown in FIG. 2, where write circuit 16 includes a negative coercive voltage supply 26 including batteries 28 and 30, and a positive coercive voltage supply 32, including batteries 34 and 36. All four batteries are connected to a common ground 38. Positive voltage supply 32 is connected with the positive terminal of battery 34 connected to the center terminal 39 of switch 40; the negative terminal of battery 36 is connected to the center terminal 42 of switch 44.

The negative terminal of battery 28 in negative voltage supply 26 is connected to the lower terminal 46 in switch 40 and the positive terminal of battery 30 is connected to lower terminal 48 in switch 44. The upper terminals 50 and 52 of switches 40 and 44, respectively, are both connected to high-frequency read signal circuit 20 and the read bias source 18. Resistor 54 and also a capacitor or capacitors within read signal circuit 20 (shown in reference to FIG. 8) limit the rate at which the read bias voltage 18 is applied to the circuit. Memory cell 12 is comprised of two memory devices, capacitor 60 and capacitor 62, which are connected between sliders 64 and 66 of switches 40 and 44, respectively. The other ends of capacitors 60 and 62 are connected to differential amplifier 22, whose output in turn is connected to detector 24. To write a 0 in cell 12, sliders 64 and 66 are connected to the center terminals 38 and 42 of switches 40 and 44. This connects the positive voltage supply 32 to each of the devices 60 and 62 in cell 12. Devices 60 and 62 are now oppositely polarized with the left side of capacitor 60 being positive and the left side of capacitor 62 being negative. This polarity condition is arbitrarily defined as 0. If using this nomenclature a 1 were desired to be stored in cell 12, switches 40 and 44 would have their sliders 64 and 66 move to the lower terminals 46 and 48, respectively, so that batteries 28 and 30 would be connected across capacitors 60 and 62 and their polarities would be the reversed from the previous condition.

In either case, to read out the stored data bias voltage from bias voltage circuit 18 is applied; the bias voltage is less than the coercive voltage. The read signal from read signal circuit 20 is applied in conjunction with the bias voltage. The read signal and the bias voltage together total less than the coercive voltage. The bias voltage is applied at a rate much slower than required for the space charge to form, while the read signal, conversely, is applied at a rate much faster than the space charge can respond. Since the bias voltage is applied simultaneously to both capacitors 60 and 62, the space charge in one capacitor, in this case capacitor 60, is increased, and the space charge in the other capacitor 62 is decreased. With the space charge in capacitor 60 increasing, the permittivity of the ferroelectric decreases. Thus the capacitance decreases and the charge transfer caused by the occurrence of the read signal decreases too. Conversely, the charge signal being transferred by capacitor 62 under these conditions increases. Thus the signal on line 80 to differential amplifier 22 is smaller than the signal on line 82, so differential amplifier puts out a low signal which detector 24 recognizes as a logical zero.

Figure 3:
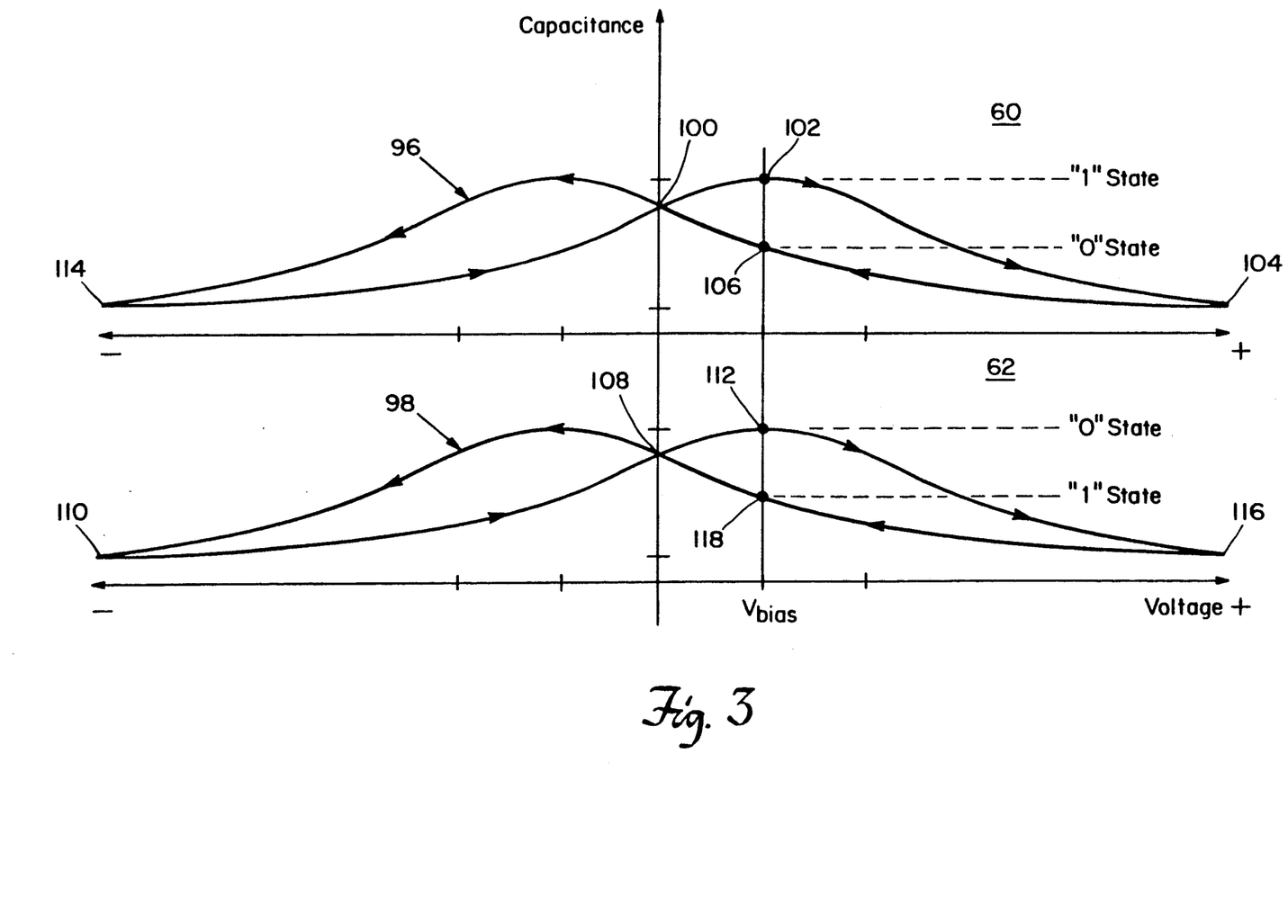
FIG. 3 is an illustration of the hysteresis curves of each of the ferroelectric space charge capacitor devices in a memory cell of the memory system according to this invention.

The operation of capacitor 60 and 62 can be better understood with reference to FIG. 3, where the capacitor versus voltage hysteresis curves 96, 98 for each of the capacitors 60, 62, respectively, is shown. There it can be seen that when a positive voltage is applied at 100 to capacitor 60 it drives the capacitance through the one state at point 102, past the coercive voltage to extreme 104, and then back to point 106, where it registers a zero state. At the same time, capacitor 62 is being driven in the opposite direction so that beginning at point 108 capacitor 62 moves to extreme 110, then back through point 108 to point 112 to record a zero state. Conversely, when capacitor 60 is driven negative from point 100 to extreme 114, then back through the origin 100 to point 102, a 1 is recorded; when capacitor 62 is driven from origin 108 through point 112 to extreme 116 and then back to point 118, a 1 is recorded. In this way the opposite voltages establish opposite polarities in the two capacitors, which have been arbitrarily defined to represent the same logical state, 0 or 1.

Figure 4:
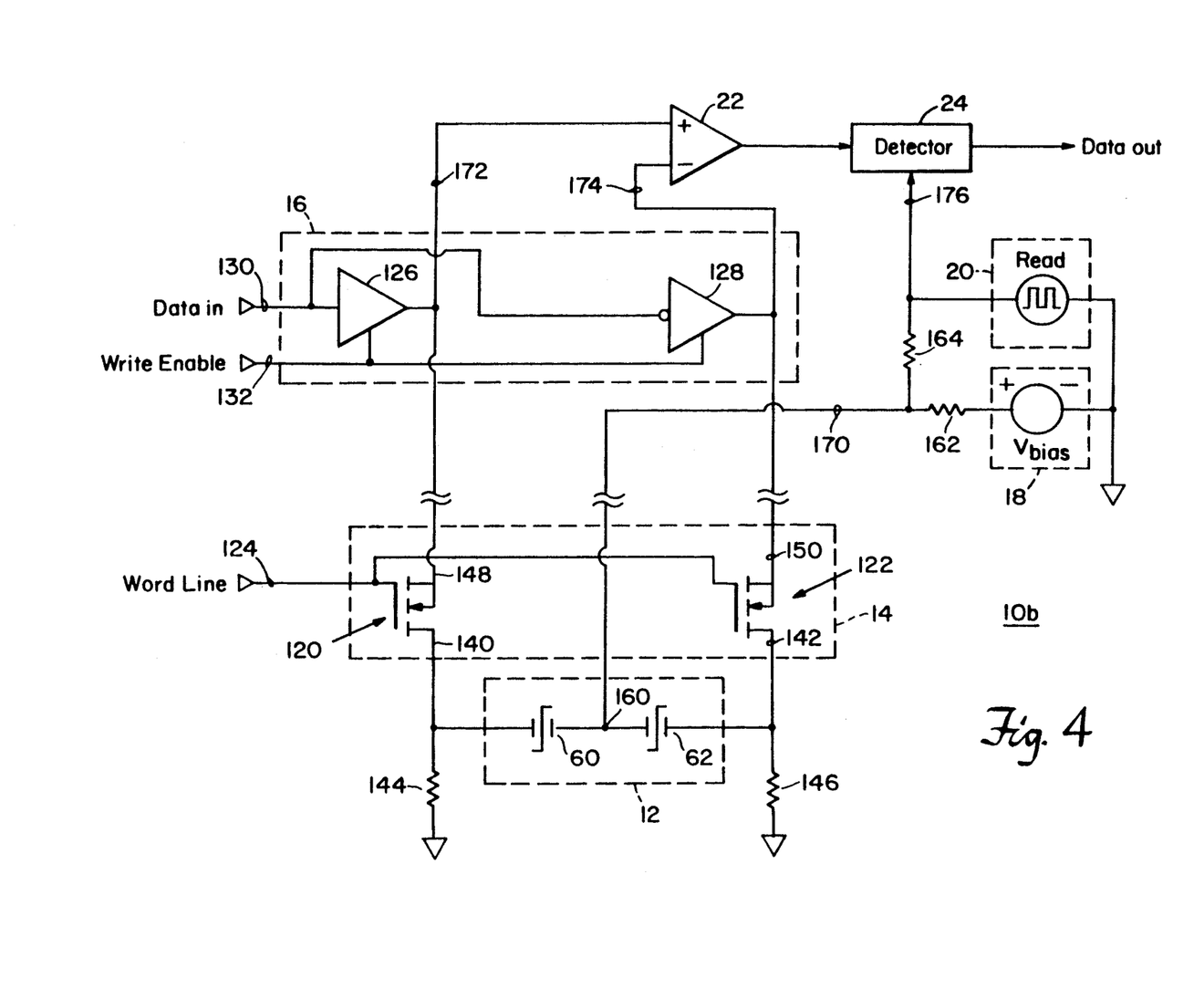
FIG. 4 is a more detailed schematic diagram of an alternative embodiment of a ferroelectric space charge capacitor memory system according to this invention.

In another embodiment, FIG. 4, the memory cell 12 includes capacitors 60 and 62 connected between FET switches 120 and 122 in switching circuit 14. FET transistors 120 and 122 are turned on by a signal on word line 124. Writing is accomplished with write circuit 16, which includes amplifier 126 and inverting amplifier 128, which receive data on line 130 and are enabled by a write enable signal on line 132. Line 124 is connected to the gate electrodes of FETs 120 and 122. The drain electrodes 140, 142 are connected to capacitors 60, 62 and resistors 144 and 146, which are balancing resistors to maintain the voltage across the capacitors 60 and 62. The source electrodes 148 and 150 of FETs 120 and 122 are connected to the outputs of amplifiers 126 and 128 in write circuit 16, and to the input of differential amplifier 22. When cell 12 is selected to be written in, the signal on line 124 closes FET switches 120 and 122. Subsequently, when write circuit is enabled on line 132 and data is supplied on line 130, amplifier 126 provides a coercive voltage of one polarity to capacitor 60 while inverting amplifier 128 provides to capacitor 62 a coercive voltage of opposite polarity. The bias voltage and read signal are constantly applied to the center tap 160 between capacitors 60 and 62. Resistors 162 and 164 act to control the rate at which the bias voltage and the read signal occur at capacitors 60 and 62.

When it is desired to read out cell 12, word line 124 is activated so that FET switches 120 and 122 are once again closed. When they are closed the read bias and read signal continuously present on line 170 and at center tap 160 are conducted through each of capacitors 60 and 62, through FETs 120 and 122 respectively, and out on lines 172 and 174 to differential amplifier 22. When the charge transferred in line 172 is greater than that in 174, the output of differential amplifier 22 is high, which detector 24 recognizes as a 1. When the converse is true, that is when line 174 carries a greater charge transfer than line 172, differential amplifier puts out a low signal which is recognized by detector 24 as zero. Detector 24 is only enabled on line 176 during the occurrence of a read signal so that the output of differential amplifier 22 is only recognized as a stored value if it occurs simultaneously with the appearance of the read signal. In that way, signals that occur during the write operations or spurious signals will not be recognized as actual data read out of the memory cell.

Figure 5:
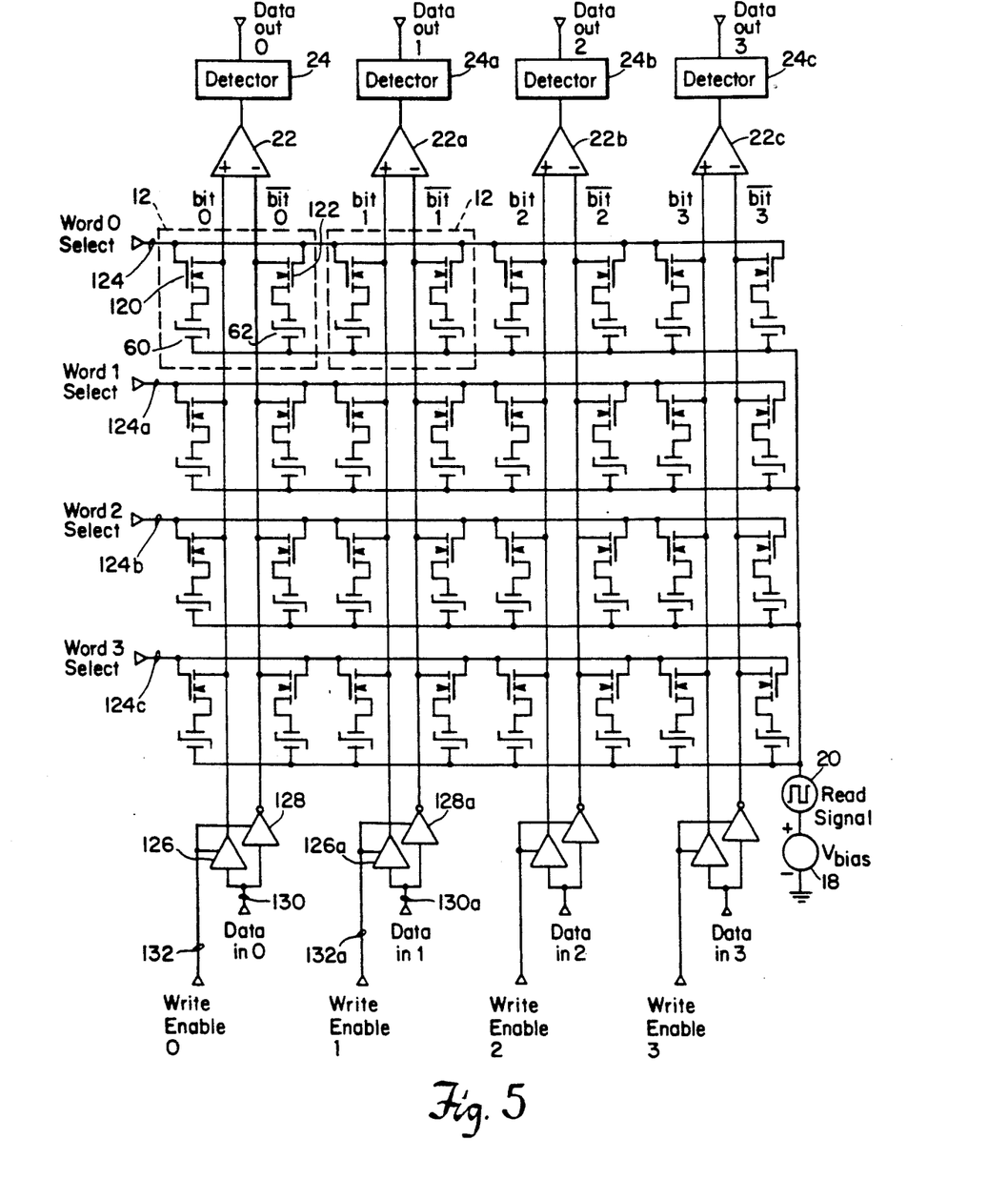
FIG. 5 is a schematic diagram of a memory array using a plurality of memory systems depicted in FIG. 4.

The differential memory cell of FIG. 4 can be used in a matrix as shown in FIG. 5, where each word line 124, 124a, 124b and 124c enables an entire row to be selected for writing. The particular cell 12 which will be written in is the one at the intersection of the enabled word line and the enabled write enable and data-in lines 130, 132, 130a, 132a, . . . Since the bias voltage and read signal are constantly supplied in parallel to each pair of capacitors 60, 62 in each cell 12, readout occurs whenever a word select line is enabled. If a write is occurring, then the stronger write coercive voltage overcomes the read signal and changes the state of the capacitor so that no read operation is performed. If no write operation is occurring, then the read signal will prevail and the output of the corresponding detector 24–24c will represent the value stored in the particular selected cell.

Figure 6:
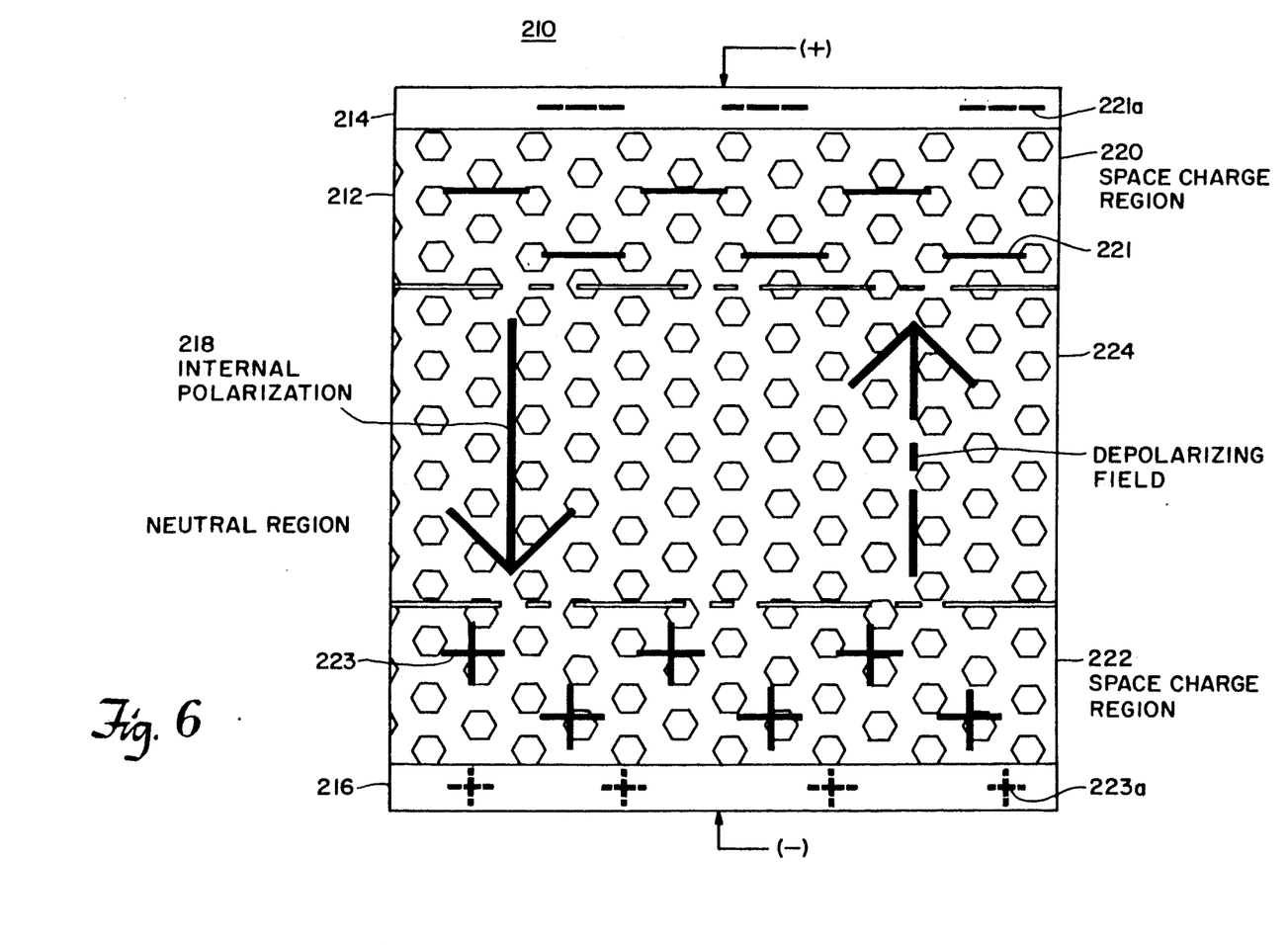
FIG. 6 is a schematic diagram of a ferroelectric space charge capacitance memory device used in the cell of this invention.
Figure 7:
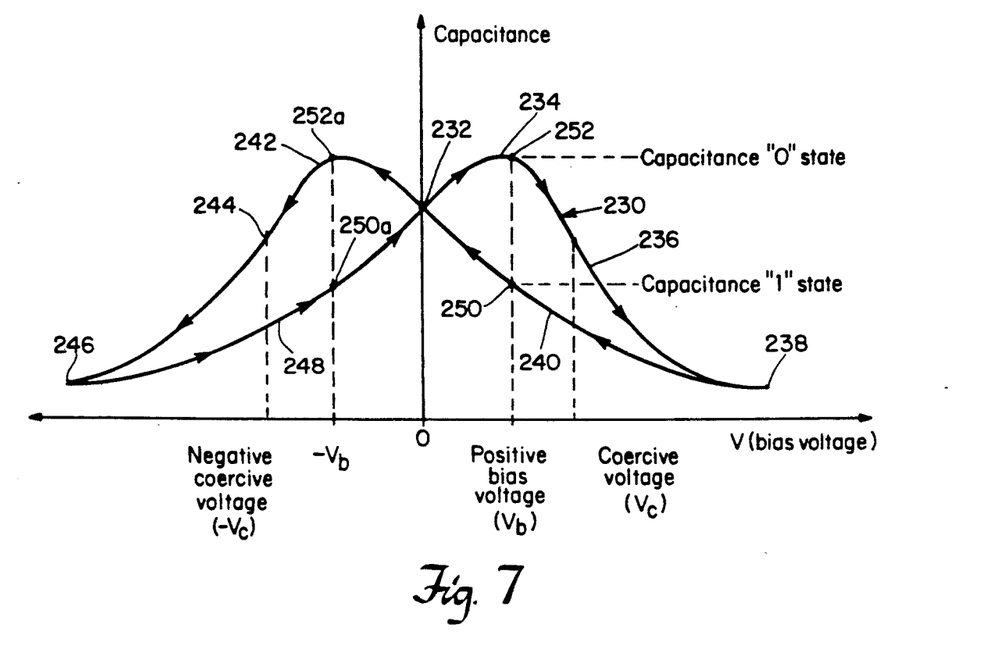
FIG. 7 is an illustration of the capacitance hysteresis characteristic of the ferroelectric capacitance memory device of FIG. 6.
Figure 8:
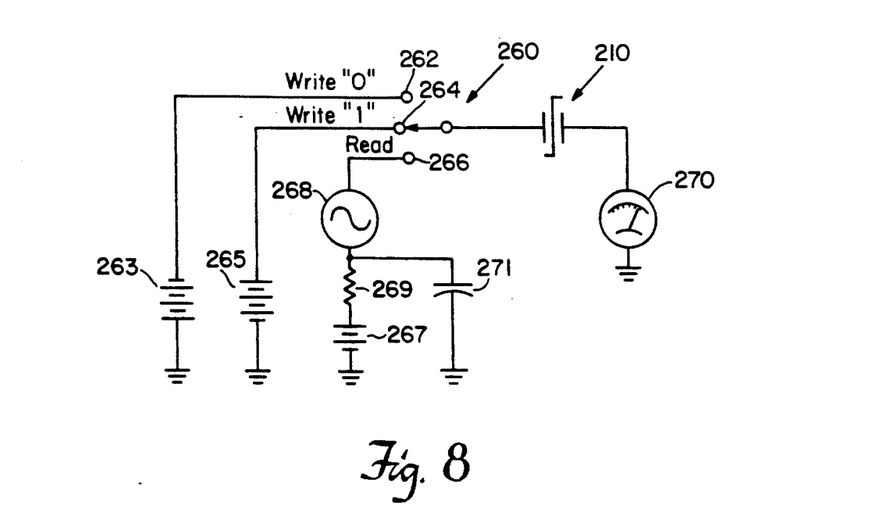
FIG. 8 is a simplified schematic diagram of a simple write and read circuit usable with the ferroelectric space charge capacitance memory device of FIG. 6.

The nature and operation of the ferroelectric space charge capacitor devices 60 and 62 may be better understood with respect to the explanation in FIGS. 6–8, where the details of construction of a single such device 60 is explained in greater detail.

There is shown in FIG. 6 a ferroelectric space charge capacitor memory device 210 including a ferroelectric dielectric medium 212 disposed between a pair of spaced electrodes 214 and 216. Ferroelectric dielectric medium 212 may be a lead-zirconium-titanate or lead-titanate ferroelectric available from Raytheon or National Semiconductor. When an external electric potential is applied across electrodes 214 and 216, an internal polarization field indicated by vector 218 is established in dielectric medium 212 by the alignment of the electric dipoles. This internal polarization field is in the same direction as the externally applied potential or voltage at electrodes 214 and 216. There results an accumulation of charge in space charge regions 220 and 222. If electrodes 214 and 216 are metal, space charge regions 220 and 222 are in the dielectric 212, as indicated by the full line − and + signs 221 and 223, respectively. If electrodes 214 and 216 are semiconductor material, then space charge regions 220 and 222 may be in both the electrodes 214, 216 and the dielectric 212, as indicated by the full line − and + signs 221, 223, and the dashed − and + signs 221a and 223a.

Space charge region 220 accumulates negative charges since it is proximate electrode 214 which has a positive potential applied to it, while space charge region 222 accumulates a positive charge since it is associated with electrode 216 that has a negative potential applied to it. A neutral region 224 occurs between space charge regions 220 and 222. The size of this neutral region 224 relative to the space charge regions establishes the capacitance value of the capacitor constituted by electrodes 214 and 216 with the dielectric material between them. As neutral region 224 becomes larger, so too does the capacitance of device 210. The size of the neutral region available to establish the capacitance value of device 210 varies inversely to the applied field. That is, as the field across electrodes 214 and 216 grows larger the neutral region 224 grows smaller, and so does the capacitance of device 210. If the initial voltage or write voltage applied across electrodes 214 and 216 reaches the coercive voltage of dielectric 212, then a certain amount of polarization, the remanent polarization, remains even after the external electric potential is removed from electrodes 214 and 216. If it is later desired to read out device 210, that is, to determine its remanent state, it is only necessary to apply a bias voltage across the electrodes 214 and 216 which is less than the coercive voltage and then apply a small read pulse which will produce a current proportional to the value of the capacitance established in neutral region 224. The bistable nature of the device 210 which enables it to be used as a memory can be better understood with respect to FIG. 7, which shows the capacitance hysteresis characteristic 230 of device 210.

There are two polarization states which device 210 can assume. The first is when the system moves from point 232 driven by a positive voltage through knee 234, leg 236 and toe 238, back along leg 240 to point 232. In that case, the polarization state shown in FIG. 6 occurs. If the write voltage instead is applied in the negative direction so that the system moves through knee 242, leg 244 and toe 246, and back up leg 248 to point 232, then the space charge regions will be charged oppositely from that shown in FIG. 6 and the internal polarization vector 218 will be reversed, to thereby establish the other polarization state.

In operation, with zero voltage applied across electrodes 214 and 216, the dielectric 212 is in the condition indicated at point 232 in FIG. 7. If the voltage across electrodes 214 and 216 is then increased, the capacitance value of the ferroelectric medium 212 increases up along knee 234 along leg 236 to positive toe 238. If at this point the positive voltage is decreased the capacitance value moves along leg 240 back to point 232. If the voltage is now increased in the negative direction, the capacitance value increases toward knee 242 and then decreases down leg 244 to the negative toe 246. A decrease in the negative voltage now moves the capacitance value along leg 248 back to point 232.

This capacitance hysteresis effect in the dielectric 212 can be utilized as a memory device. For example, if a voltage has been applied at point 232, which drives the capacitance value up over knee 234, down leg 236 to toe 238 and back along leg 240 so that the system has been driven beyond the coercive voltage $V_C$ and back again to the lower, positive bias voltage $V_b$ at point 250 on leg 240, the bit of information has been written into dielectric medium 212. If the voltage across electrodes 214 and 216 is now removed completely so that the system reverts to point 232, ferroelectric medium 212 stores or remembers its last previous condition at point 250. Subsequently, if a bias voltage $V_b$ is applied, ferroelectric medium 212 moves back down leg 240 to point 250. Now a small high-frequency pulse superimposed on $V_b$ at 250 causes a current to flow through medium 212 which is proportional to its capacitance and will thus reflect its polarization condition, which in this case is the polarization condition indicated by the low capacitance level at 250.

If during the write cycle the voltage was driven negative from point 232 over knee 242, down leg 244 to toe 246, back again up leg 248, through zero point 232, to point 252 on knee 234, then when the voltage is removed and the system reverts to point 232, it is the point 252 condition that will be remembered. Thus subsequently when the read bias $V_b$ is applied, the system will move to point 252, which is a much higher capacitive state, indicating the other polarization state. Thus when a small high-frequency read pulse is applied, a higher level of current flow indicating a higher level of capacitance will be indicated.

In FIG. 7, the higher level of capacitance 250 has been labelled the binary one state while the higher level of capacitance 252 has been labelled the zero state. This is arbitrary as the converse denomination could also have been chosen. Similarly, instead of applying a positive bias voltage, the system could work with a negative bias voltage, in which case the capacitive states thus far explained would be reversed, and the "1" and "0" values would be inverted. In either case the bias voltage $V_b$, be it positive or negative, must not exceed the coercive voltage, $V_b$ must be applied at a rate slower than the rate at which the space charge can form, and the read pulse should have a high enough frequency, typically 1000 cycles per second or greater, so that it can induce the current to detect the capacitance level before the space charge distributions can be affected. The signal should be small in magnitude so that it does not exceed the coercive voltage when added to the bias voltage.

A simple implementation of a circuit for writing and reading memory device 210, FIG. 6, is shown in FIG. 8, where memory device 210 is connected through a three-way switch 260 to the write 262, 264 and read terminals 266. When switch 260 is connected to terminal 262, negative bias is applied from battery 263 through switch 260 to write a zero into device 210. When switch 260 is connected to terminal 264, a possitive bias is applied from battery 265 to device 210 to write a one. Subsequently, when those biases are removed the remanent polarization maintains the one or the zero that was written there. Later, when switch 260 is connected to terminal 266, the bias voltage $V_b$ is applied from battery 267 to drive the system to the remembered point, such as point 250, along the hysteresis characteristic 230. Resistor 269 and capacitor 271 limit the rate at which the bias voltage is applied, which must be slower than the rate at which the space charge forms. To accomplish this, the product of the resistance of resistor 269 and the capacitance of capacitor 271 must be greater than the time for space charge accumulation (1 ms–100 ms). Then a small high-frequency pulse is supplied by pulse generator 268 to produce a current flow through device 210 which can be detected by an AC current sensor 270. If the current is low, i.e. the capacitance sensed is low, then that represents a one state as explained in FIG. 2. If the current is high, that indicates high capacitance, which represents a zero state.

The distinction between this invention and prior art ferroelectric capacitor memory devices is that the prior art devices change the state of polarization during readout while this invention does not. In prior art ferroelectric capacitor devices the read voltage displaces the internal polarization field and generates a pulse of current whose magnitude represents the state (0 or 1) of the capacitor memory. In contrast, this invention manipulates the dielectric properties of the ferroelectric capacitor to effect the memory function. In this invention the bias voltage does not displace the internal polarization field. Rather, the bias voltage displaces and is completely dropped across the space charges without affecting the internal polarization field. The bias voltage is less than the coercive voltage and is applied more slowly than the rate at which the space charge can form. That is, the bias voltage is not allowed to exceed the space charge and begin to displace the internal polarization field. In lead-zirconate and lead-zirconate-titanate it is preferred that the bias voltage reach maximum in more than approximately one millisecond for typical thin film, high-quality, ferroelectric capacitor material.

To read out the state of the memory a read pulse is applied superimposed on the bias voltage. The total of the bias voltage and the read pulse does not exceed the coercive voltage. Further, the rate of application and removal of the read pulse is faster than the space charge can respond so that the resulting read current occurs before there is any significant change in the size of the space charge relative to the internal polarization field. Thus, even though there is a momentary transfer of charge there is no net effect on the internal polarization field. Therefore, the read-out operation is entirely nondestructive.

Although specific features of the invention are shown in some drawings and not others, this is for convenience only as each feature may be combined with any or all of the other features in accordance with the invention.

Other embodiments will occur to those skilled in the art and are within the following claims.

What is claimed is:

1. A ferroelectric space charge capacitor memory system comprising:
   a ferroelectric space charge capacitor memory cell including two ferroelectric space charge capacitor memory devices;
   each said ferroelectric space charge capacitor memory device having a pair of spaced first and second electrodes and a ferroelectric dielectric disposed between said electrodes;
   means for applying a coercive write voltage to each said memory device and to establish internal polarization fields and space charge regions of opposite polarities in each said device writing each said memory device into one of two polarization states and establishing in each polarization state proximate the interface between said dielectric and each electrode a said space charge region having a charge opposite to that applied to the electrode with a neutral region between the space charge regions, the relative sizes of said neutral and space charge regions defining the capacitance of the dielectric, said neutral region having an internal polarization field opposite to that represented by the space charge regions;
   means for applying, to each of said devices, a bias voltage less than the coercive voltage at a rate slower than the rate of space charge formation to define a capacitive level representative of one of the polarization states;
   means for introducing to each said device a read signal at a rate faster than the rate of space charge formation which together with the bias voltage is less than the coercive voltage; and
   means, responsive to the read signal, for indicating the difference in charge transferred by each memory device representing the logical state of said memory cell including means, responsive to the introduction of the read signal to said dielectric, for determining the capacitance level representative of one of said polarization states.

2. The ferroelectric space charge capacitive memory of claim 1 further including means for selectively connecting either said coercive write voltage to said memory cell or said charge transferred to said means for indicating.

3. The ferroelectric space charge capacitive memory system of claim 1 in which said means for applying a bias voltage and said means for introducing a read signal are connected in parallel with said memory devices in said cell.

4. The ferroelectric space charge capacitive memory system of claim 1 in which said means for applying a bias voltage and said means for introducing a read signal are connected continuously to said memory devices in said cell.

5. The ferroelectric space charge capacitor memory system of claim 1 in which said means for determining the capacitance includes means for detecting the displacement current transferred through said dielectric in response to said read signal.

6. The ferroelectric space charge capacitor memory system of claim 1 in which said two polarization states include a first state in which the positive pole of the dielectric is proximate said first electrode and the negative pole is proximate said second electrode, and a second state in which the negative pole of the dielectric is proximate said first electrode and the positive pole is proximate said second electrode.

7. The ferroelectric space charge capacitor memory system of claim 1 in which said bias voltage establishes an electric field that increases said internal electric field and the size of said space charge region with a concomitant decrease in capacitance when it is additive with said internal polarization field, and decreases said internal electric field and the the size of said space charge region with a concomitant increase in capacitance when it is subtractive with said internal polarization field.

8. The ferroelectric space charge capacitor memory system of claim 1 in which said read signal momentarily induces through said dielectric a displacement current which is proportional to the capacitance representative of the polarization state of said dielectric.

9. The ferroelectric space charge capacitor memory system of claim 1 in which said electrodes are metal and said space charge regions are in said dielectric.

10. The ferroelectric space charge capacitor memory system of claim 1 in which said electrodes are semiconductors and said space charge regions are at least partially in said electrodes.

* * * * *